US011418203B2

(12) United States Patent
Mair et al.

(10) Patent No.: US 11,418,203 B2
(45) Date of Patent: Aug. 16, 2022

(54) FREQUENCY LOCKED LOOPS AND RELATED CIRCUITS AND METHODS

(71) Applicant: MEDIATEK Singapore Pte. Ltd., Singapore (SG)

(72) Inventors: Hugh Thomas Mair, San Jose, CA (US); Ashish Kumar Nayak, San Jose, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/377,267

(22) Filed: Jul. 15, 2021

(65) Prior Publication Data

US 2022/0085820 A1   Mar. 17, 2022

Related U.S. Application Data

(60) Provisional application No. 63/078,924, filed on Sep. 16, 2020.

(51) Int. Cl.
*H03L 7/099* (2006.01)
*G06F 1/324* (2019.01)
*H03L 7/081* (2006.01)

(52) U.S. Cl.
CPC .............. *H03L 7/099* (2013.01); *G06F 1/324* (2013.01); *H03L 7/081* (2013.01)

(58) Field of Classification Search
CPC ......... H03L 7/081; H03L 7/099; H03L 7/085; H03L 7/087; G06F 1/234
See application file for complete search history.

(56) References Cited

U.S. PATENT DOCUMENTS

| 9,590,642 | B2* | 3/2017 | Haneda | H03L 7/085 |
| 9,628,089 | B1* | 4/2017 | Jain | H03K 5/135 |
| 2011/0241423 | A1 | 10/2011 | Bridges et al. | |
| 2017/0300080 | A1 | 10/2017 | Jain et al. | |
| 2020/0225723 | A1* | 7/2020 | Zonensain | G06F 1/3293 |

OTHER PUBLICATIONS

Bowman et al., A 22 nm all-digital dynamically adaptive clock distribution for supply voltage droop tolerance. IEEE Journal of Solid-State Circuits. Jan. 28, 2013;48(4):907-16.

(Continued)

*Primary Examiner* — Diana J. Cheng
(74) *Attorney, Agent, or Firm* — Wolf, Greenfield & Sacks, P.C.

(57) ABSTRACT

Clock circuits designed to compensate for supply voltage fluctuations (e.g., supply voltage droops) in central processing units (CPUs) are described. The clock circuits described herein involve reducing the clock frequency in response to a decrease to the supply voltage to a value that is approximately equal (or below) to the maximum operating frequency of the CPU at that particular supply voltage. The clock circuits described herein may include a frequency locked loops (FLL). Such FLLs may be designed to lock to a reference frequency when the supply voltage is approximately constant and to deviate from the reference frequency in response to variations in the supply voltage. In some embodiments, an FLL operates in the same supply voltage domain as the CPU.

19 Claims, 9 Drawing Sheets

(56) References Cited

OTHER PUBLICATIONS

Grenat et al., 5.6 adaptive clocking system for improved power efficiency in a 28nm x86-64 microprocessor. 2014 IEEE International Solid-State Circuits Conference Digest of Technical Papers (ISSCC) Feb. 9, 2014:106-7.
Kurd et al., Next generation intel core™ micro-architecture (Nehalem) clocking. IEEE Journal of Solid-State Circuits. Mar. 24, 2009;44(4):1121-9.
Extended European Search Report for European Application No. 21190362.0. dated Jan. 31, 2022.
Mair et al., 2.5 A 7nm FinFET 2.5 GHz/2.0 GHz Dual-Gear Octa-Core CPU Subsystem with Power/Performance Enhancements for a Fully Integrated 5G Smartphone SoC. 2020 IEEE International Solid-State Circuits Conference-(ISSCC) Feb. 1, 2020 16:50-52.

\* cited by examiner

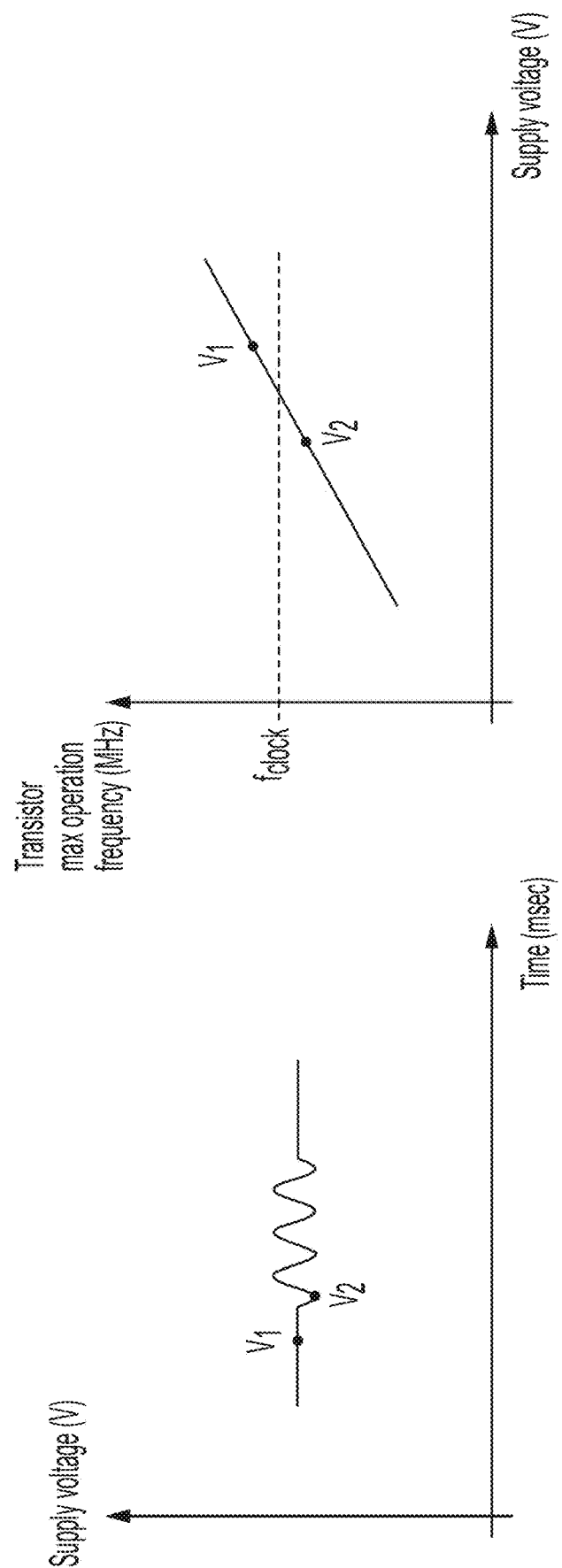

FREQUENCY LOCKED LOOPS AND RELATED CIRCUITS AND METHODS

CROSS REFERENCE TO RELATED APPLICATIONS

This application claims priority under 35 U.S.C. § 119(e) to U.S. Provisional Application Ser. No. 63/078,924, entitled "FREQUENCY LOCKED LOOP (FLL) TO MITIGATE PERFORMANCE IMPACT AND STRENGTHEN CPU ROBUSTNESS UNDER LARGER POWER DISTRIBUTION NETWORK (PDN) LOSSES" filed on Sep. 16, 2020, which is herein incorporated by reference in its entirety.

BACKGROUND

Phase locked loops (PLLs) are circuits used in electronics to generate stable frequencies having specific relationships to a reference frequency (usually the frequency of a crystal oscillator). PLLs can generate frequencies that are significantly larger than the reference frequency. For example, a PLL can produce several gigahertz from a reference frequency of a few hundred megahertz.

BRIEF SUMMARY

Some embodiments relate to a clock circuit comprising a frequency locked loop (FLL). The FLL comprises a circuit configured to produce a signal representing a first frequency; an output coupled to a clock input of a central processing unit (CPU); and an oscillator configured to lock to the first frequency; and a power supply coupled to both the oscillator and the CPU.

Some embodiments relate to a clock circuit comprising a frequency locked loop (FLL) coupled between a clock output of a clock source and a clock input of a central processing unit (CPU), the FLL comprising an oscillator configured to lock to a first frequency produced by the clock source. The CPU and the oscillator are configured to operate in a same supply voltage domain.

Some embodiments relate to a method for clocking a central processing unit (CPU) using a frequency locked loop (FLL). The method comprises receiving a supply voltage; receiving a signal representing a first frequency; providing a clock signal to the CPU based on the signal and the supply voltage, wherein the CPU is supplied with the supply voltage, and wherein the providing comprises: locking the clock signal to the first frequency; and causing the clock signal to deviate from the first frequency in response to a variation in the supply voltage.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

FIG. 1A is a plot illustrating a representative supply voltage as a function of time, in accordance with some embodiments.

FIGS. 1B-1C are plots illustrating the maximum operating frequency of a representative transistor as a function of the supply voltage, in accordance with some embodiments.

DETAILED DESCRIPTION

Figure 1C:
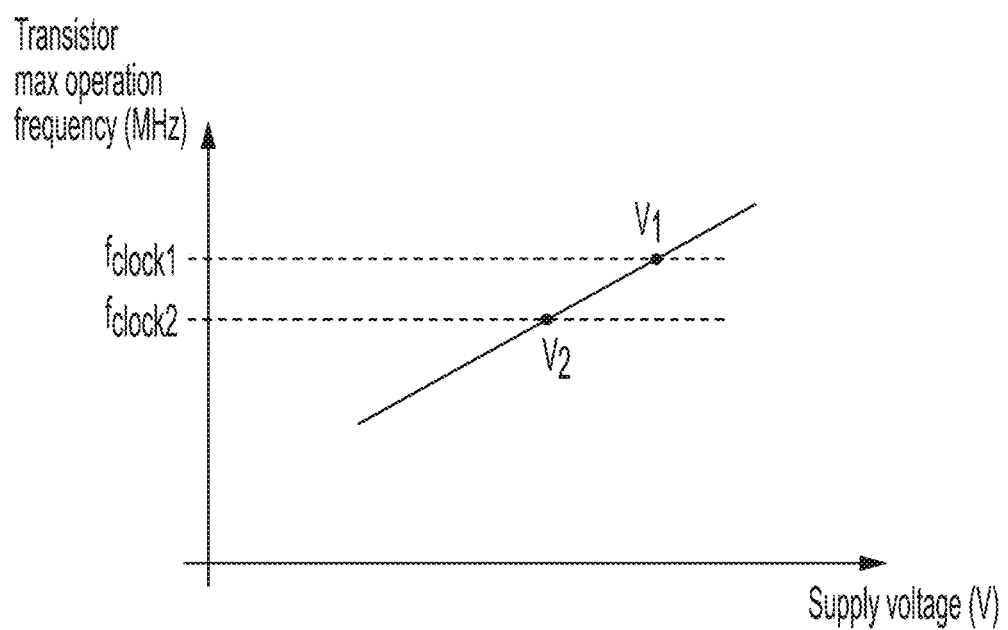

The inventors have recognized that modern central processing units (CPU) suffer from loss of performance (e.g., speed) caused by unstable power distribution networks. Power distribution networks are circuits configured to provide supply voltages to CPUs, thus powering the operations of the CPUs. The increased current and power densities that characterize modern power distribution networks inevitably lead to undesired fluctuations in supply voltage, which can negatively affect the performance of a CPU. This is because the maximum speed at which a transistor can be switched on and off depends, among other parameters, on the supply voltage. The larger the supply voltage applied to a transistor, the larger the switching speed that the transistor can reach.

As used herein, the term "CPU" includes any suitable type of processing units, including for example general purpose processors, single-core processors, multi-core processors, graphics processing units, application specific integrated circuits, digital signal processors, physical processing units, field programmable gate arrays, microcontrollers, etc.

FIG. 1A is a plot illustrating the supply voltage of a representative power distribution network as a function of time, in accordance with some embodiments. Ideally, the supply voltage exhibits a constant value over time. Unfortunately, this is very difficult to achieve in modern CPUs, primarily due to the large current and power densities present in the circuitry of a CPU. In the depiction of FIG. 1A, the supply voltage varies in a periodic fashion. In this case, supply voltage $V_1$ is greater than supply voltage $V_2$. In other circumstances, the supply voltage may vary differently. For example, a supply voltage may exhibit a sharp droop at time ti and may subsequently increase slowly over time.

FIG. 1B is a plot illustrating the maximum operating frequency (e.g., switching frequency) of a representative transistor as a function of the supply voltage, in accordance with some embodiments. This curve reflects the fact that the cut-off frequency of a transistor is voltage-dependent. In this example, the voltage-frequency dependency is linear, but not all embodiments are limited in this respect as other behaviors (quadratic, polynomial, logarithmic, exponential, etc.) are also possible. The voltage-frequency dependency may be defined, for example, by the transistor design and/or the technology used in the fabrication of the transistor.

As shown, the maximum operating frequency increases with increasing supply voltage (the shape and slope of the curve depend on several parameters, including the node used in the fabrication of the transistor and the transistor layout). As a result, the maximum operating frequency corresponding to supply voltage $V_1$ is greater that the maximum operating frequency corresponding to supply voltage $V_2$. This plot illustrates one problem. In some circumstances, the supply voltage drops by a sufficient amount to cause the maximum operating frequency to fall below the frequency of the clock ($f_{clock}$) that clocks the CPU. When this happens, the performance of the transistor (and as a result, of the CPU) degrades as the transistor is unable to keep up with the frequency of the clock.

The inventors have developed clock circuits that compensate for supply voltage fluctuations (e.g., supply voltage droops) in CPUs. The clock circuits developed by the inventors can reduce the clock frequency in response to a decrease in the supply voltage to a value that is approximately equal to (or below) the maximum operating frequency of the CPU at that particular supply voltage. This concept is illustrated in FIG. 1C, in accordance with some embodiments. Under regular conditions, the supply voltage is equal to $V_1$ and the clock frequency is set to a value ($f_{clock1}$) approximately equal to the maximum operating frequency of the transistor at $V_1$. When the supply voltage drops to $V_2$ due to a fluctuation in the power distribution network, the clock frequency may be set to a value ($f_{clock2}$) approximately equal to the maximum operating frequency of the transistor at $V_2$. Thus, the transistors of a CPU may be consistently operated at a value that tracks or is close to their maximum operating frequency.

In some embodiments, the clock circuits developed by the inventors include frequency locked loops (FLLs). FLLs of the types described herein may lock to a reference frequency when the supply voltage is approximately constant and deviate from the reference frequency in response to variations in the supply voltage. In some embodiments, an FLL operates in the same supply voltage domain as the CPU. For example, both the FLL and the CPU may receive the same voltage from a common power supply (e.g., without DC-DC converters altering the voltage level). Accordingly, the FLL and the CPU experience the same supply voltage fluctuations. Using this approach, the FLL clocks the CPU with a frequency that follows the maximum operating frequency of the CPU's transistors.

In some embodiments, an FLL may be used in connection with a clock source (e.g., a crystal oscillator with a phased locked loop (PLL)). During regular operations, the FLL is configured to lock to the frequency of the clock source. However, when a variation in the supply voltage occurs, the FLL is configured to deviate from the frequency of the clock source and to follow the maximum operating frequency of the CPU's transistors. In alternative to (or in addition to) a clock source, in some embodiments a value generator may be used to output a signal representing a desired frequency. In such embodiments, the FLL is configured to lock to the frequency represented by the signal. The signal may represent the desired frequency in any of numerous ways. For example, the signal may be analog, and a characteristic of the analog signal (e.g., amplitude, power, phase, frequency, etc.) may be indicative (e.g., proportional or based on a predefined relationship) of the desired frequency. Alternatively, the signal may be digital and may be encoded with a value (e.g., binary, decimal, hexadecimal, etc.) indicative of the desired frequency.

In some embodiments, the FLL may include one or more ring oscillators (or other types of oscillators). The ring oscillator(s) may be configured with controllable delay units. The frequency produced by the FLL can be controlled by controlling the delay of the ring oscillator(s). In some embodiments, the controllable delay units of a ring oscillator may be controlled based on variations of the supply voltage. For instance, when the supply voltage received by a ring oscillator is $V_1$, the delay of the ring oscillator may be set to $d_1$. However, when the supply voltage received by a ring oscillator drops to $V_2$, the delay of the ring oscillator may be set to $d_2$, where $d_2 > d_1$. In other words, the delay is increased with decreasing voltage supply, thereby reducing the frequency produced by the FLL in response to a supply voltage decrease. In some embodiments, the ring oscillator(s) may be in the same supply voltage domain as the CPU, thereby allowing the ring oscillator(s) to produce the delay necessary to permit the FLL to follow the maximum operating frequency of the CPU's transistors.

Accordingly, some embodiments are directed to a clock circuit comprising a clock source having a clock output and configured to produce a clock signal at a first frequency, and an FLL coupled between the clock output of the clock source and a clock input of a CPU. The FLL may comprise a ring oscillator configured to lock to the first frequency. The clock circuit may further comprise a power supply coupled to both the ring oscillator and the CPU.

Figure 2A:
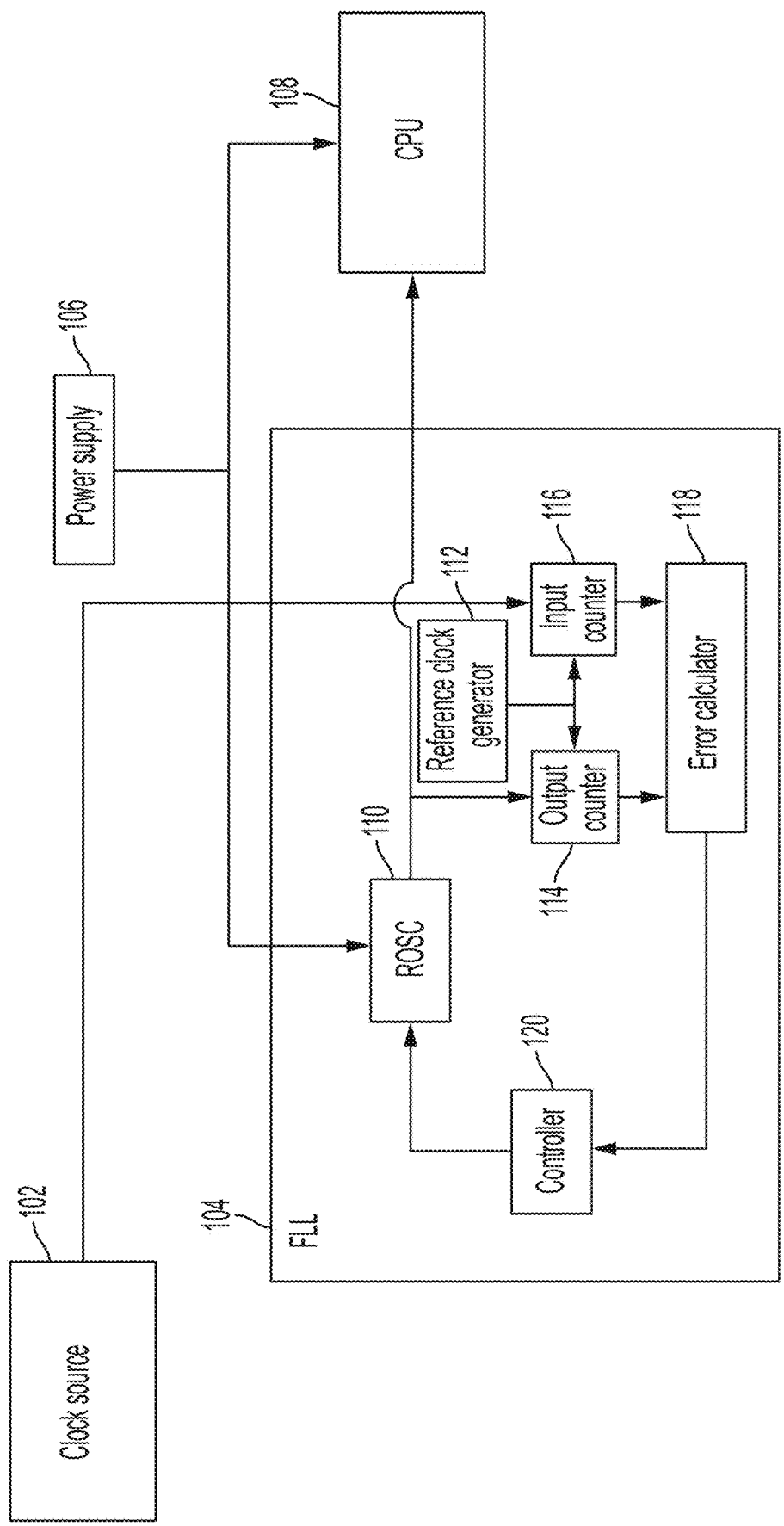
FIG. 2A is a block diagram illustrating a representative clock circuit including a frequency locked loop, in accordance with some embodiments.

FIG. 2A is a block diagram illustrating a circuit for clocking a CPU 106, in accordance with some embodiments. The clock circuit includes a clock source 102, an output 103, an FLL 104 and a power supply 106. The clock circuit clocks the operations of CPU 108. Power supply 106 may include, for example, an AC-DC converter, a switched-mode regulator, a linear regulator, a capacitive regulator, or any suitable combination thereof. Power supply 106 provides a supply voltage to both FLL 104 and CPU 108, so that FLL 104 and CPU 108 may receive substantially the same voltage from the power supply. Accordingly, FLL 104 and CPU 108 are in the same supply voltage domain. In the embodiment, there are no DC-DC converters between power supply 106 and there are no DC-DC converters between power supply 106 and FLL 104. Output 103 is coupled to a clock input of CPU 108.

Clock source 102 may include an oscillator (e.g., a crystal oscillator). In some embodiments, clock source 102 may further include circuitry for increasing the frequency of the oscillator. For example, in some embodiments, it may be desirable to produce a frequency in the gigahertz range, but the oscillator may be able to produce at few tens of megahertz at most. Thus, clock source 102 may include a frequency multiplier, such as a PLL.

FLL 104 includes ring oscillator (ROSC) 110. ROSC 110 may be controlled by a digital control loop to keep the frequency output by the FLL approximately equal to the frequency output by the clock source. ROSC 110 may be further controlled to deviate from the frequency of the clock source for short periods, for example in response to momentary fluctuations in the supply voltage. In some embodiments, fluctuations in the supply voltage outside the bandwidth of a power distribution network may result in speeding up and slowing down of the ring oscillator. Since ROSC 110 is in the same supply voltage domain as the CPU in that it is provided with the same supply voltage, the frequency fluctuations produced by the ring oscillator may mimic the varying maximum operating frequency of the CPU. Hence, when a voltage supply droop occurs, ROSC 110 exhibits a drop in frequency that follows (e.g., is proportional to) the voltage supply droop. This lowering in local clock frequency provides additional timing margin to the transistors inside the CPU, allowing the CPU to maintain robust operation despite the lowered voltage supply.

Figure 2B:
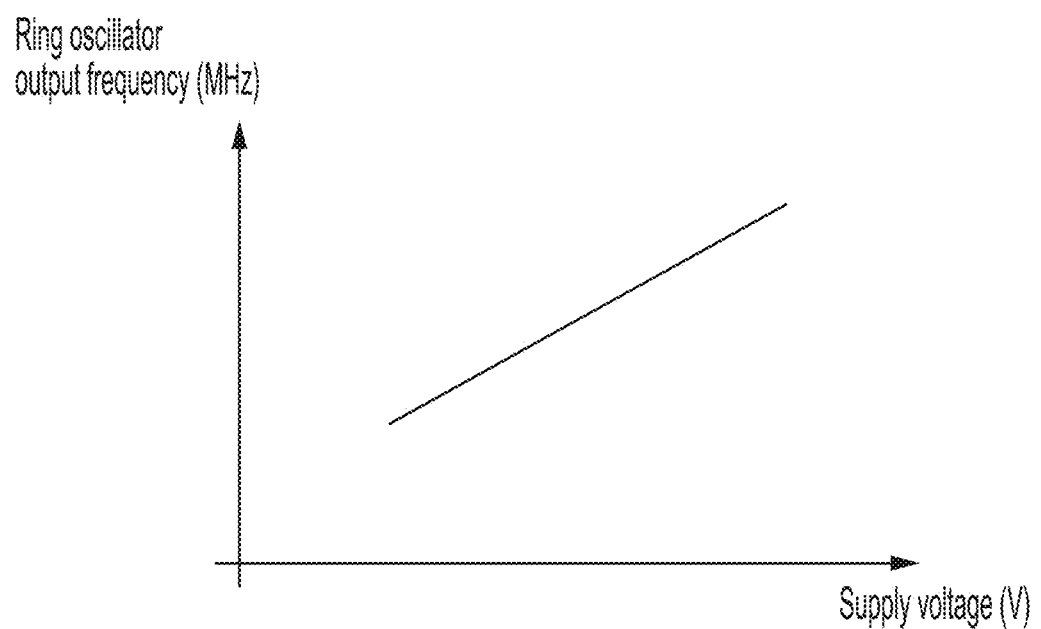
FIG. 2B is a plot illustrating the output frequency for a representative ring oscillator as a function of the supply voltage, in accordance with some embodiments.

FIG. 2B is a plot illustrating the output frequency of a representative ROSC 110 as a function of the supply voltage, in accordance with some embodiments. As depicted in this figure, ROSC 110 is designed to vary its output frequency depending upon the level of the supply voltage. More specifically, ROSC 110 decreases its output frequency as the supply voltage decreases. In some embodiments, ROSC 110 may be designed so that the shape of the voltage-frequency characteristic of FIG. 2B approximately matches the shape of the voltage-characteristic of FIG. 1B. For example, ROSC 110 may be designed so that the slope of the voltage-frequency characteristic of FIG. 2B approximately matches the slope of the voltage-characteristic of FIG. 1B. Additionally, or alternatively, ROSC 110 may be designed so that the behavior (e.g., linear, quadratic, polynomial, logarithmic, exponential, etc.) of the voltage-frequency characteristic of FIG. 2B approximately matches the behavior of the voltage-characteristic of FIG. 1B. Because ROSC 110 and CPU 108 are in the same supply voltage domain, having approximately matching shapes ensures that the frequency produced by ROSC 110 is approximately equal to the maximum operating frequency of the CPU at any level of the supply voltage.

Referring back to FIG. 2A, FLL 104 further includes reference clock generator 112, output counter 114, input counter 116, error calculator 118 and controller 120. These components may be designed to i) lock the output frequency of ROSC 110 to the frequency of the clock produced by clock source 102 and ii) allow the output frequency of ROSC 110 to deviate, at least momentarily, from the frequency of the clock produced by clock source 102 in response to variations in supply voltage.

Output counter 114 monitors the output frequency of ROSC 110 on the basis of the reference clock produced by reference clock generator 112. For example, the reference clock may have a 26 MHz-frequency, and the output counter may count how many cycles occur in one cycle of the reference clock. Similarly, input counter 116 monitors the output frequency of clock source 102 on the basis of the reference clock produced by reference clock generator 112. Counters 114 and 116 provide values indicative of the respective frequencies to error calculator 118. Error calculator 118, in turn, produces an error signal representative of the difference between the frequencies sensed by the counters. For example, at times when the frequency of ROSC 110 is locked to the frequency of the clock source, the error signal may be equal to zero. By contrast, at times when the frequency of ROSC 110 differs from the frequency of the clock source, the error signal may differ from zero.

The error signal may be provided to controller 120. In some embodiments, controller 120 includes a proportional-integral (PI) controller, though other types of controllers, including proportional, integral, derivative, or any suitable combination thereof, may be used. In some embodiments, a PI controller is beneficial because it reduces steady-state errors. Controller 120 may be designed to cause the output frequency of ROSC 110 to track the frequency of the clock source.

Figure 3:
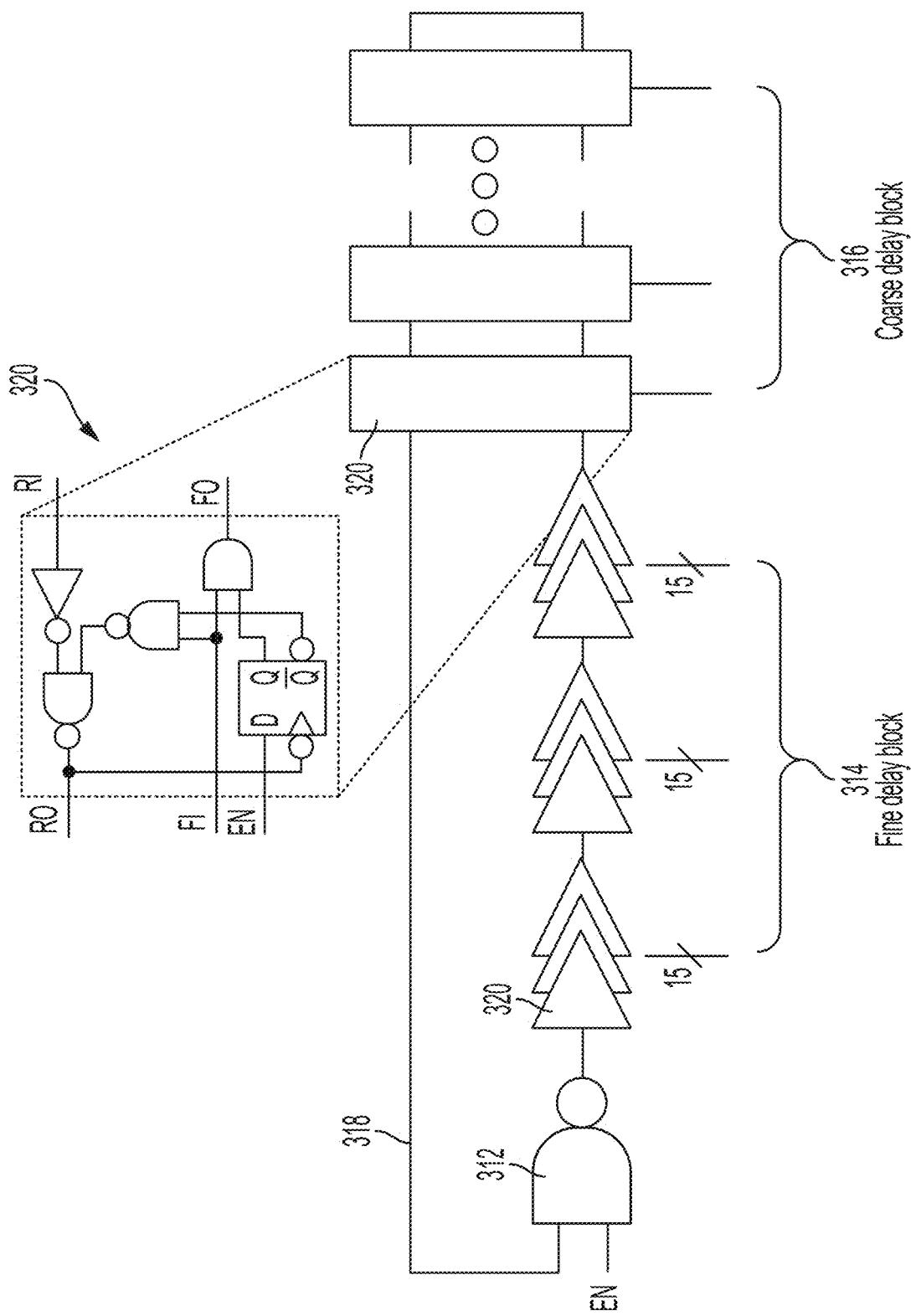
FIG. 3 is a block diagram illustrating a representative ring oscillator, in accordance with some embodiments.

As discussed above, ROSC 110 may be configured to vary its output frequency depending upon variations in the supply voltage. In some embodiments. ROSC 110 includes a plurality of controllable delay units. The delay provided by the controllable delay units may be set on the basis of the supply voltage received from power supply 106. FIG. 3 is a block diagram illustrating a representative ring oscillator including a plurality of controllable delay units. In this example, ROSC 110 includes a fine delay block 314 and a coarse delay block 316. Fine delay block 314 includes a plurality of fine delay units, which, in this example, are implemented using controllable buffers 320. Each buffer, when activated, may introduce a relatively small delay, such as less than 5 ps (e.g., approximately 1 ps). In this example, fine delay block 314 includes nine buffers (though not all embodiments are limited to a particular number of buffers), each with 6 bits for setting a programmable delay, for a total of 45 bits of fine control.

Coarse delay block 316 includes a plurality of coarse delay units, which, in this example, are implemented using flip flops. Each coarse delay unit, when activated, may introduce a relatively large delay, such as more than 10 ps (e.g., approximately 20 ps). Both the fine delay block and the coarse delay block may be controlled using a digital code. For example, the fine delay block may be controlled using a fine delay code and the coarse delay block may be controlled using a coarse delay code. In one implementation, when increasing the coarse delay code, the fine delay code may be adjusted by $-¼$ of the fine control range (e.g., $-11$ codes); conversely, when decreasing the coarse delay code, the fine delay code is adjusted by $+¼$ of the fine control range (e.g., $+11$ codes). In some embodiments, the codes may represent the supply voltage received at the ring oscillator. As such, the delay introduced by the fine and coarse delay blocks may, collectively, reflect variations in the supply voltage.

In some embodiments, the delay units may be implemented using the same types of logic gates and transistors used in CPU 108, thereby allowing the frequency of the ring oscillator to approximately match the maximum operating frequency of the CPU at any given supply voltage. For example, both the transistors of CPU 108 and ROSC 110 may be fabricated using the same fabrication process and in accordance with the same transistor layout.

In the example of FIG. 3, ROSC 110 further includes a loop 318 and a logic gate 312. Collectively, loop 318 and a logic gate 312 enable ROSC 110 to form a closed loop, thereby translating changes in delay to changes in output frequency.

Figure 4:
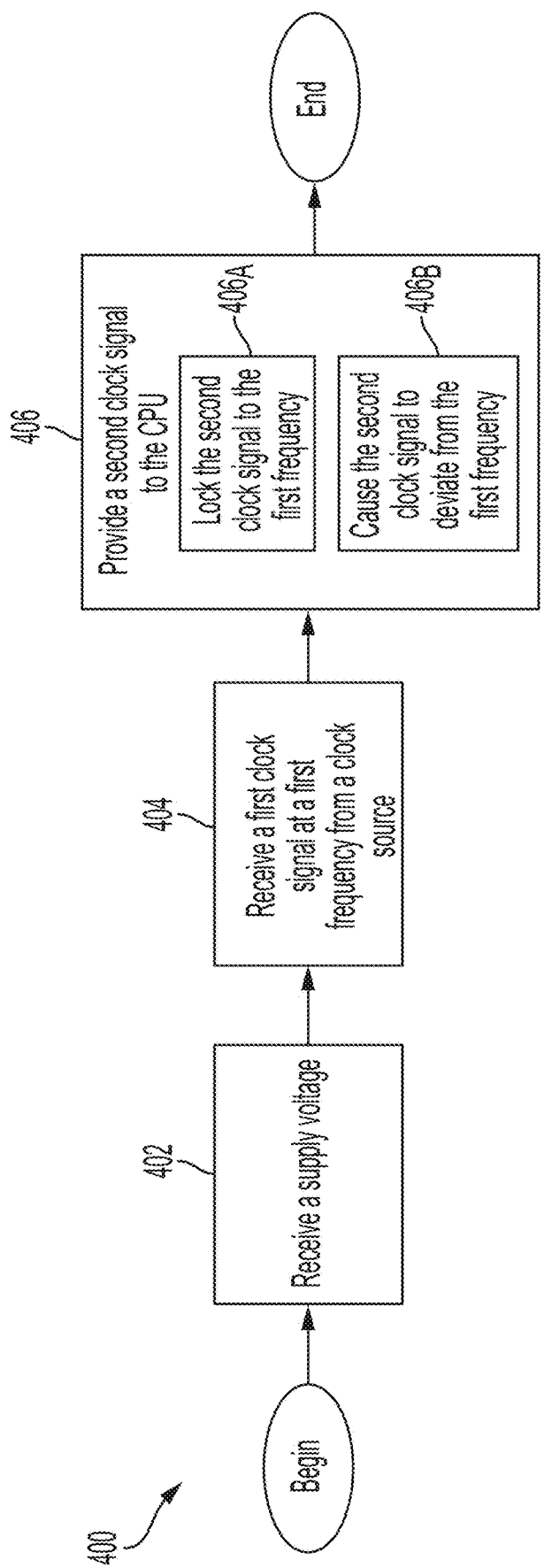
FIG. 4 is a flowchart illustrating a representative method for clocking a central processing unit, in accordance with some embodiments.

FIG. 4 is a flowchart illustrating a representative method for clocking a CPU, in accordance with some embodiments. Method 400 may be implemented using the clock circuit of FIG. 2A or using any other suitable circuit. Method 400 beings at step 402, in which a clock circuit receives a supply voltage. The supply voltage may be generated by a power supply that is coupled to both the clock circuit and the CPU, resulting in the clock circuit being in the same supply voltage domain as the CPU.

At step 404, the clock circuit receives a first clock signal at a first frequency from a clock source. Referring for example to FIG. 2A, at step 404, FLL 104 may receive the clock signal generated by clock source 102.

At step 406, the clock circuit provides a second clock signal to the CPU based on the supply voltage received at step 402 and the first clock signal received at step 404. Step 406 may involve locking the second clock signal to the first frequency (sub-step $406_A$), and causing the second clock signal to deviate from the first frequency in response to a variation in the supply voltage (sub-step $406_B$).

In some embodiments, sub-step $406_A$ involves counting a first number of transitions associated with the first clock signal, counting a second number of transitions associated with the second clock signal, and controlling the second clock signal based on the first and second numbers of transitions (using for example output counter 114, input counter 116, error calculator 118 and controller 120 of FIG. 2A).

In some embodiments, sub-step $406_B$ involves reducing the frequency of the second clock signal below the first frequency in response to a reduction in the supply voltage. This may be achieved, for example, by increasing a delay provided by the FLL (using for example fine delay block 314 and/or coarse delay block 416 of FIG. 3).

Figure 5:
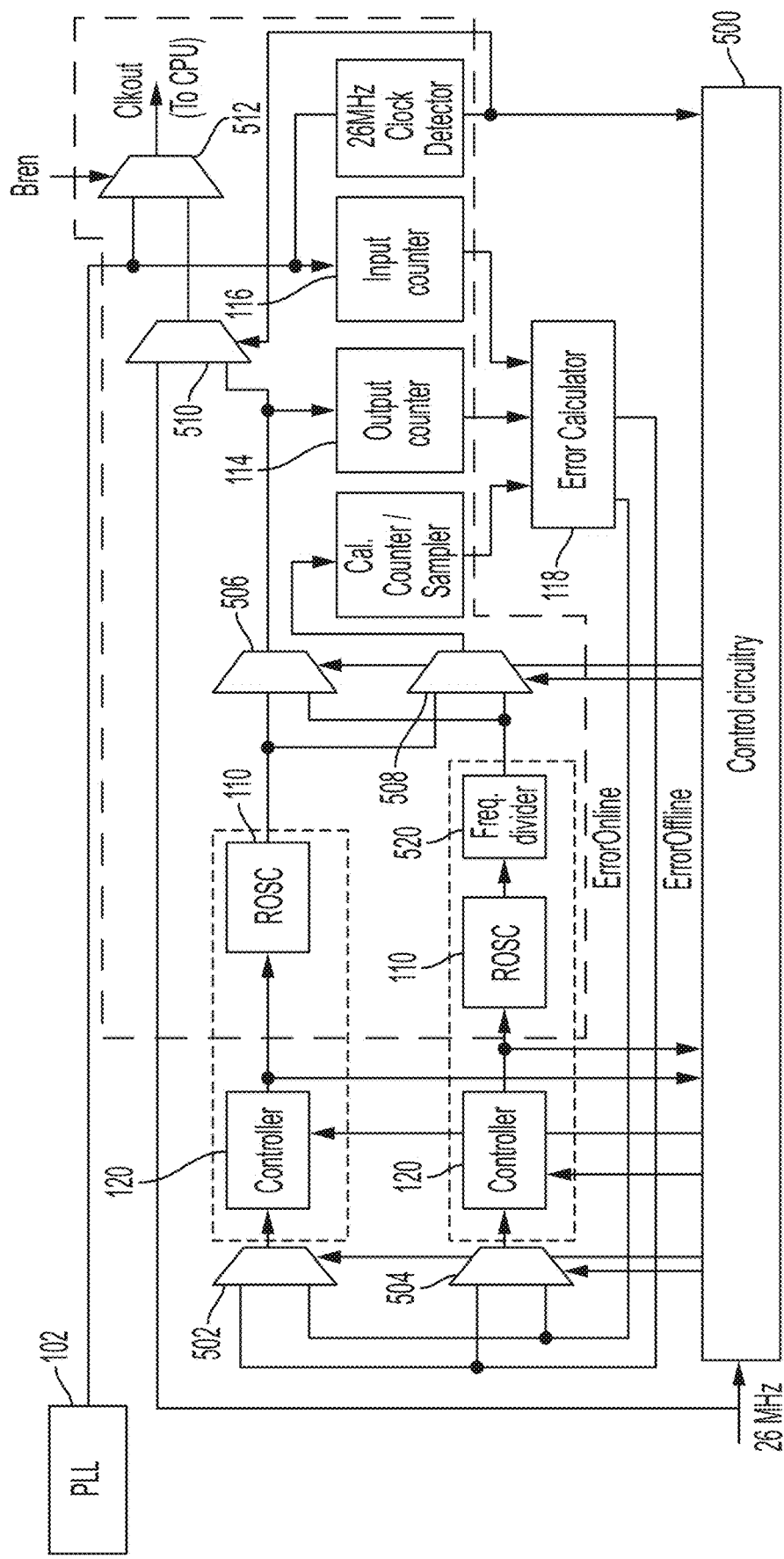
FIG. 5 is a block diagram illustrating a representative frequency locked loop including multiple ring oscillators, in accordance with some embodiments.

The FLL depicted in FIG. 2A includes one ring oscillator. In other implementations, an FLL may include more than one ring oscillator. Having multiple ring oscillators results in an extension of the frequency dynamic range of the FLL, in some embodiments. One such implementation is depicted in FIG. 5, in accordance with some embodiments. This implementation includes a pair of ring oscillators 110. One of the rings oscillators is followed by a frequency divider 520, which produces an extension of the frequency dynamic range of the FLL to smaller frequencies. For example, the frequency divider may divide the frequency of a ROSC 110 by two.

As in the implementation of FIG. 2A, output counter 114, input counter 116 and error calculator 118 provide an indication of the difference between the frequency of the clock source and the frequency of the FLL. In some embodiments, only one of the ring oscillators supplies the clock to the output at a time. For example, the oscillator that supplies the clock to the output may be the oscillator corresponding to the "Error Online" signal, and the oscillator that does not supply the clock to the output may be the oscillator corresponding to the "error Offline" signal. The Error Offline signal is used in some embodiments to lock the offline oscillator, and may be proportional to the frequency difference between the offline oscillator and the reference clock. Instead, the Error Online signal may be used in some embodiments to lock the online oscillator, and may be proportional to both the frequency difference and the phase difference between the online oscillator and the reference clock. Both oscillators may be locking at the same time. Control circuitry 500 may select one of the oscillators to be online and the other oscillator to be offline based on the frequency range required to meet the reference clock frequency.

Multiplexers 502 and 504 are coupled to the respective controllers 120, and select one between Error Online and Error Offline, for example on the basis of the frequency of the clock source. Multiplexers 510 and 512 selects one between the output of the clock source and the output of the FLL. Effectively, multiplexers 510 and 512 allow the clock circuit to bypass the FLL when so desired.

In yet other embodiments, an FLL may include more than two ring oscillators. One ring oscillator may be followed by a factor 2-frequency divider, another ring oscillator may be followed by a factor 4-frequency divider, another ring oscillator may be followed by a factor 8-frequency divider, etc. In this way, the frequency dynamic range of the FLL can be further extended.

Figure 6A:
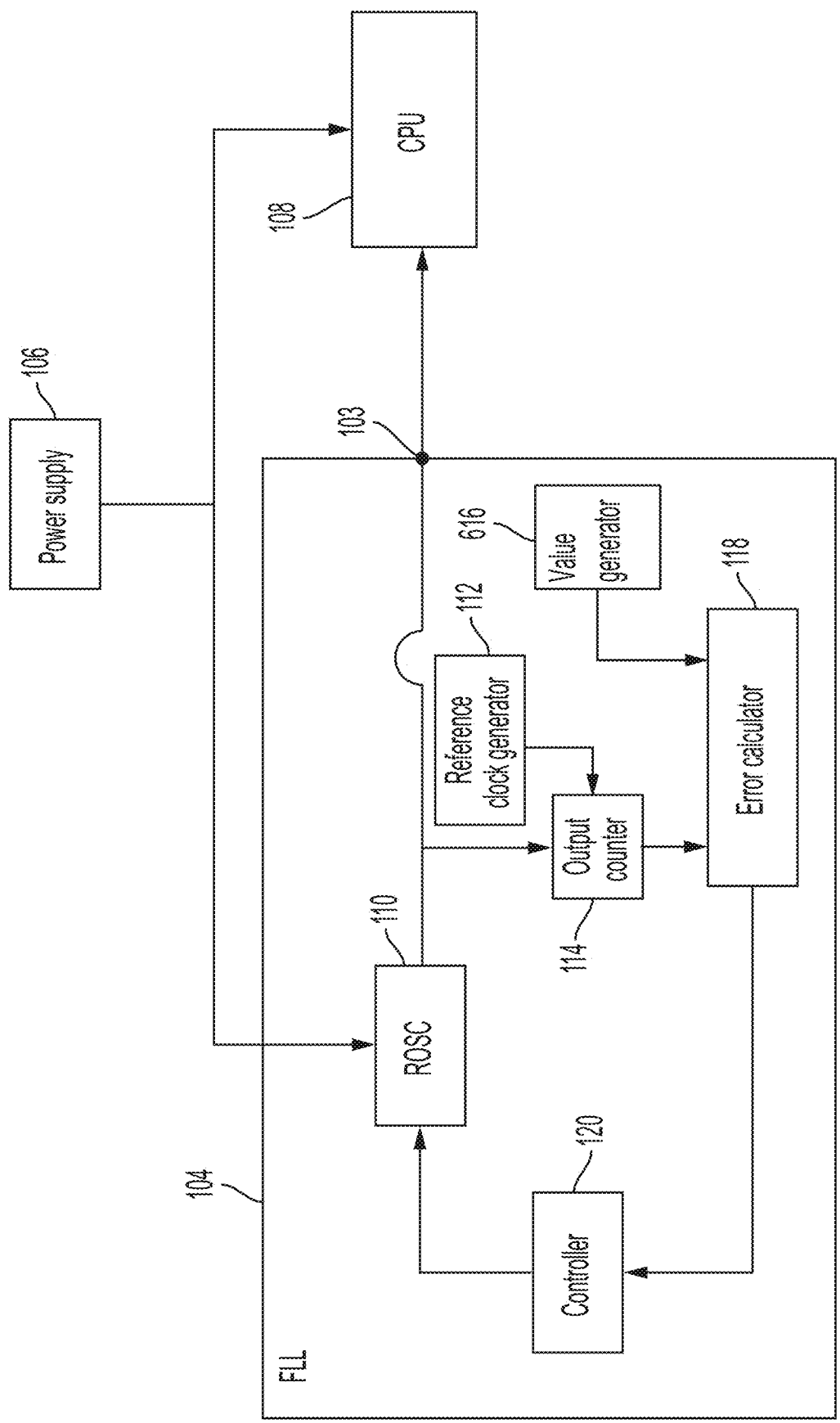
FIG. 6A is a block diagram illustrating another representative clock circuit including a frequency locked loop, in accordance with some embodiments.

FIG. 6A illustrates an alternative clock circuit including an FLL, in accordance with some embodiments. In this arrangement, instead of locking to the frequency produced by a clock source, the FLL 104 may be configured to lock to a virtual frequency. As shown in FIG. 6A, FLL 104 includes a value generator 616. Value generator 616 is configured to produce a signal (e.g., analog or digital) representing a target frequency. This signal is provided as an input to error calculator 118. Thus, in this arrangement, FLL 104 locks to the target frequency represented by the signal produced by value generator 616. As in the arrangement of FIG. 2A, the output frequency of the FLL deviates from the target frequency in response to variations in the supply voltage.

Figure 6B:
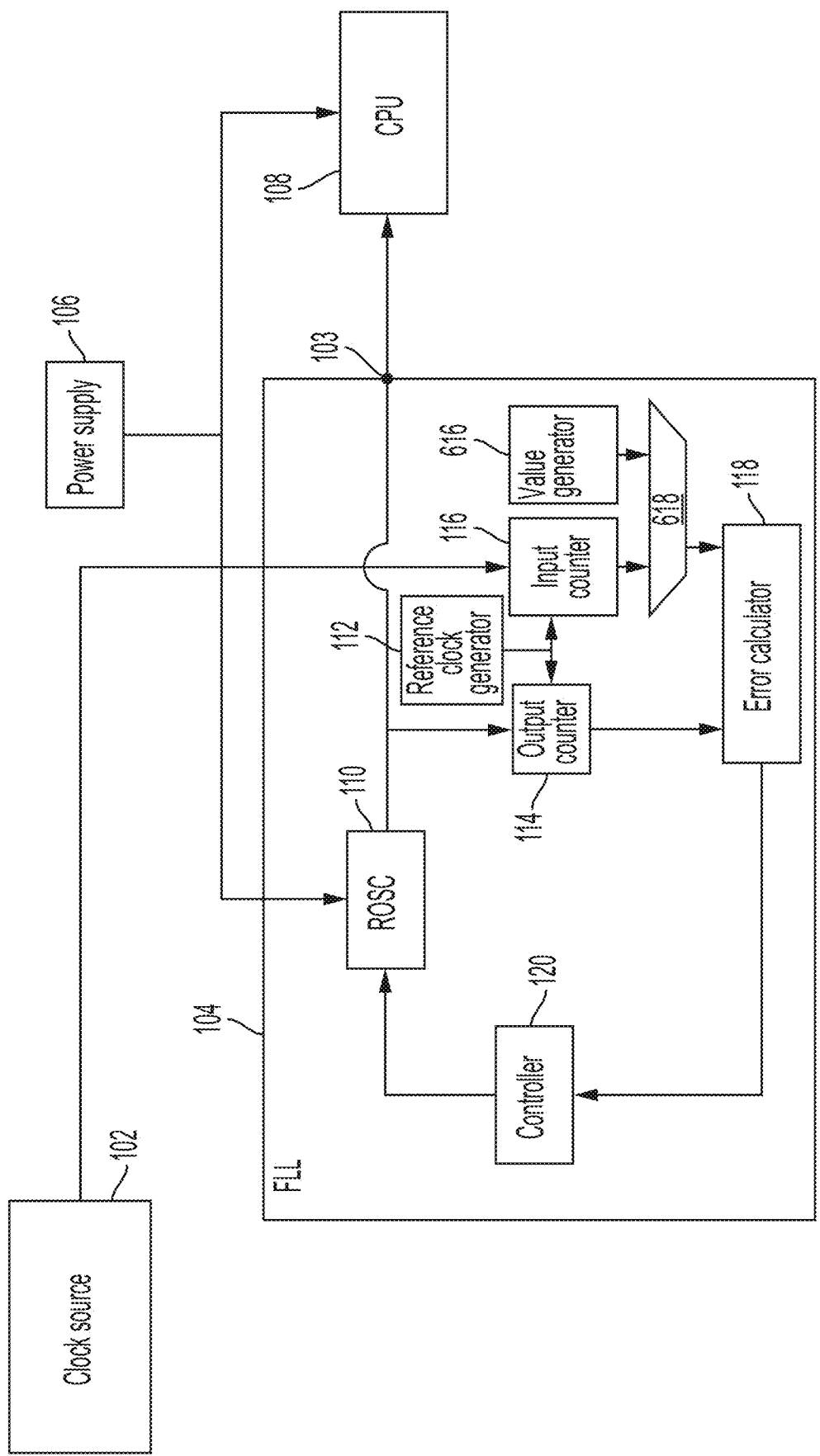
FIG. 6B is a block diagram illustrating yet another representative clock circuit including a frequency locked loop, in accordance with some embodiments.

FIG. 6B illustrates an alternative clock circuit including an FLL, in accordance with some embodiments. This arrangement combines the arrangement of FIG. 2A with the arrangement of FIG. 6A in that the FLL includes both input counter 116 and value generator 616. A multiplexer 618 selects one between the output of input counter 116 and the output of value generator 616, for example based on a selection signal. Using the selection signal, a user may decide whether to lock the FLL to the frequency of clock source 102 or to lock the FLL to a virtual frequency.

Thus, some embodiments relate to an FLL comprising a circuit (e.g., input counter 116 and/or value generator 616) configured to produce a signal (e.g., analog or digital) representing a first frequency, an output coupled to a clock input of a central processing unit (CPU), and a ring oscillator configured to lock to the first frequency. The first frequency may be the frequency output by clock source 102 or a virtual frequency.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

The terms "approximately", "substantially," and "about" may be used to mean within ±10% of a target value in some embodiments. The terms "approximately" and "about" may include the target value.

What is claimed is:

1. A clock circuit comprising:
  a frequency locked loop (FLL) comprising:
    a circuit configured to produce a signal representing a first frequency;
    an output coupled to a clock input of a central processing unit (CPU); and
    an oscillator configured to lock to the first frequency; and
  a power supply coupled to both the oscillator and the CPU,
  wherein the CPU comprises a first logic gate of a first type and the oscillator comprises a second logic gate of the first type.

2. The clock circuit of claim 1, wherein:
  the CPU exhibits a maximum operation frequency associated with a first supply voltage of the power supply, and
  the oscillator is configured to produce a second frequency approximately equal to the maximum operation frequency of the CPU when the oscillator is supplied with the first supply voltage.

3. The clock circuit of claim 1, wherein the FLL further comprises a controller configured to, in response to a variation in a supply voltage supplied by the power supply to the oscillator, cause the oscillator to deviate from the first frequency.

4. The clock circuit of claim 3, wherein the controller is configured to, in response to a droop in the supply voltage, cause the oscillator to produce a frequency less than the first frequency.

5. The clock circuit of claim 1, wherein the circuit is configured to produce the signal representing the first frequency in response to receiving a clock signal at the first frequency.

6. The clock circuit of claim 5, wherein the FLL further comprises:
a counter coupled to a clock output of the oscillator; and
an error calculator coupled to both the circuit and the counter, wherein the oscillator is configured to lock to the first frequency using an output of the error calculator.

7. The clock circuit of claim 1, wherein the oscillator comprises a controllable delay unit.

8. The clock circuit of claim 7, wherein the controllable delay unit comprises a fine delay unit and a coarse delay unit.

9. The clock circuit of claim 1, wherein the oscillator is a first oscillator and wherein the FLL further comprises:
a second oscillator configured to lock to the first frequency;
a frequency divider coupled to the second oscillator; and
a multiplexer coupled to both the first oscillator and the frequency divider.

10. A clock circuit comprising:
a frequency locked loop (FLL) coupled between a clock output of a clock source and a clock input of a central processing unit (CPU), the FLL comprising an oscillator configured to lock to a first frequency produced by the clock source, and
wherein the CPU and the oscillator are configured to operate in a same supply voltage domain and wherein the CPU comprises a first logic gate of a first type and the oscillator comprises a second logic gate of the first type.

11. The clock circuit of claim 10, wherein:
the CPU exhibits a maximum operation frequency associated with a first supply voltage, and
the oscillator is configured to produce a second frequency approximately equal to the maximum operation frequency of the CPU when the oscillator is supplied with the first supply voltage.

12. The clock circuit of claim 10, wherein the FLL further comprises a controller configured to, in response to a variation in a supply voltage supplied to the oscillator, cause the oscillator to deviate from the first frequency.

13. The clock circuit of claim 10, wherein the FLL further comprises:
a first counter coupled to the clock output of the clock source;
a second counter coupled to a clock output of the oscillator; and
an error calculator coupled to both the first and second counters, wherein the oscillator is configured to lock to the first frequency using an output of the error calculator.

14. The clock circuit of claim 10, further comprising a power supply configured to produce the supply voltage domain, wherein the clock circuit lacks DC-DC converters between the power supply and the CPU and lacks DC-DC converters between the power supply and the oscillator.

15. A method for clocking a central processing unit (CPU) using a frequency locked loop (FLL), the method comprising:
receiving a supply voltage;
receiving a signal representing a first frequency;
providing a clock signal to the CPU based on the signal and the supply voltage, wherein the CPU is supplied with the supply voltage, and wherein the providing comprises:
with an oscillator, locking the clock signal to the first frequency, wherein the CPU comprises a first logic gate of a first type and the oscillator comprises a second logic gate of the first type; and
causing the clock signal to deviate from the first frequency in response to a variation in the supply voltage.

16. The method of claim 15, wherein the causing comprises:
reducing a second frequency of the clock signal below the first frequency in response to a reduction in the supply voltage.

17. The method of claim 15, wherein the causing comprises controlling a delay provided by the FLL.

18. The method of claim 17, wherein controlling the delay comprises controlling a fine delay and controlling a coarse delay.

19. The method of claim 15, the locking comprises:
counting a number of transitions associated with the clock signal; and
controlling the clock signal based on the number of transitions and the signal.

* * * * *